US010825990B2

(12) United States Patent
Eom et al.

(10) Patent No.: US 10,825,990 B2
(45) Date of Patent: Nov. 3, 2020

(54) IMAGE SENSOR AND METHODS OF FABRICATING AND MEASURING IMAGE SENSOR

(71) Applicant: SAMSUNG ELECTRONICS CO., LTD., Suwon-si (KR)

(72) Inventors: Da Il Eom, Goyang-si (KR); Keewon Kim, Yeongtong-gu (KR); Byeongtaek Bae, Yongin-si (KR); Minkyung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/589,330

(22) Filed: Oct. 1, 2019

(65) Prior Publication Data

US 2020/0251658 A1    Aug. 6, 2020

(30) Foreign Application Priority Data

Feb. 1, 2019    (KR) .......................... 10-2019-0013382

(51) Int. Cl.
| H01L 51/00 | (2006.01) |
| H01L 27/30 | (2006.01) |
| H01L 51/42 | (2006.01) |
| H01L 21/66 | (2006.01) |
| H01L 27/146 | (2006.01) |

(52) U.S. Cl.
CPC .......... *H01L 51/0031* (2013.01); *H01L 22/30* (2013.01); *H01L 27/307* (2013.01); *H01L 51/4213* (2013.01); *H01L 51/4253* (2013.01); *G02F 2203/69* (2013.01); *H01L 27/14605* (2013.01); *H01L 27/14621* (2013.01); *H01L 27/14636* (2013.01); *H01L 27/14647* (2013.01)

(58) Field of Classification Search
CPC .............. H01L 51/0031; H01L 27/307; H01L 27/14636; H01L 22/30; H01L 51/4213; G02F 2203/69
See application file for complete search history.

(56) References Cited

U.S. PATENT DOCUMENTS

| 8,212,201 | B2 | 7/2012 | Murata |
| 8,298,855 | B2 | 10/2012 | Ihama |
| 8,698,141 | B2 | 4/2014 | Inomata |
| 9,343,508 | B2 | 5/2016 | Ichiki |
| 9,954,034 | B2 | 4/2018 | Lee et al. |
| 2015/0001663 | A1* | 1/2015 | Lee ................... H01L 27/14627 257/432 |

FOREIGN PATENT DOCUMENTS

| JP | 9-162256 A | 6/1997 |
| JP | 2017-59898 A | 3/2017 |
| KR | 10-0234367 B1 | 12/1999 |

* cited by examiner

*Primary Examiner* — Feifei Yeung Lopez
(74) *Attorney, Agent, or Firm* — Sughrue Mion, PLLC

(57) ABSTRACT

A method of measuring an image sensor is disclosed. The method includes connecting a measurement unit to an image sensor, producing an electric current, which sequentially flows through a second connection line, second lower electrodes, an upper electrode, first lower electrodes, and a first connection line of the image sensor, using the measurement unit, and measuring an alignment state of the lower electrodes, the photoelectric conversion layer, and the upper electrode.

20 Claims, 13 Drawing Sheets

IMAGE SENSOR AND METHODS OF FABRICATING AND MEASURING IMAGE SENSOR

CROSS-REFERENCE TO RELATED APPLICATIONS

This U.S. non-provisional patent application claims priority under 35 U.S.C. § 119 from Korean Patent Application No. 10-2019-0013382, filed on Feb. 1, 2019, in the Korean Intellectual Property Office, the entire contents of which are herein incorporated by reference in its entirety.

BACKGROUND

1. Field

The present disclosure relates to an image sensor and methods of fabricating and measuring image sensor, and in particular, to a method of measuring an alignment state of a photoelectric conversion layer and electrodes of an image sensor.

2. Description of Related Art

An image sensor is a semiconductor device configured to covert optical images into electrical signals. The image sensor may be classified into two types: a charge coupled device (CCD) type and a complementary metal-oxide-semiconductor (CMOS) type. In general, the CMOS-type image sensor is called "CIS". The CIS includes a plurality of two-dimensionally arranged pixels, each of which includes a photodiode (PD) that coverts incident light into an electrical signal.

SUMMARY

It is an aspect to provide an image sensor, which is configured to measure an alignment state of a photoelectric conversion layer and electrodes.

According to an aspect of an embodiment, a method of measuring an image sensor may include connecting a measurement unit to an image sensor, the image sensor including a substrate, first lower electrodes on the substrate, second lower electrodes on the substrate, a photoelectric conversion layer covering at least a portion of the second lower electrodes, an upper electrode covering the photoelectric conversion layer and at least a portion of the first and second lower electrodes, a first connection line connected to the first lower electrodes, and a second connection line connected to the second lower electrodes, producing an electric current, which sequentially flows through the second connection line, the second lower electrodes, the upper electrode, the first lower electrodes, and the first connection line, using the measurement unit, and measuring an alignment state of the lower electrodes, the photoelectric conversion layer, and the upper electrode.

According to another aspect of an embodiment, a method of fabricating an image sensor may include connecting a measurement unit to an image sensor, the image sensor including a substrate, first lower electrodes on the substrate, second lower electrodes on the substrate, a photoelectric conversion layer covering at least a portion of the second lower electrodes, and an upper electrode covering the photoelectric conversion layer and at least a portion of the first and second lower electrodes, producing an electric current, which sequentially flows through the second lower electrodes, the upper electrode, and the first lower electrodes, using the measurement unit, and measuring a number of the second lower electrodes in contact with the upper electrode.

According to another aspect of an embodiment, an image sensor may include a substrate having a first surface and a second surface facing each other, first lower electrodes and second lower electrodes provided on the first surface, a photoelectric conversion layer covering at least a portion of the second lower electrodes, an upper electrode covering the photoelectric conversion layer and at least a portion of the first and second lower electrodes, a first connection line connected to the first lower electrodes, and a second connection line connected to the second lower electrodes.

BRIEF DESCRIPTION OF THE DRAWINGS

Example embodiments will be more clearly understood from the following brief description taken in conjunction with the accompanying drawings, in which.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
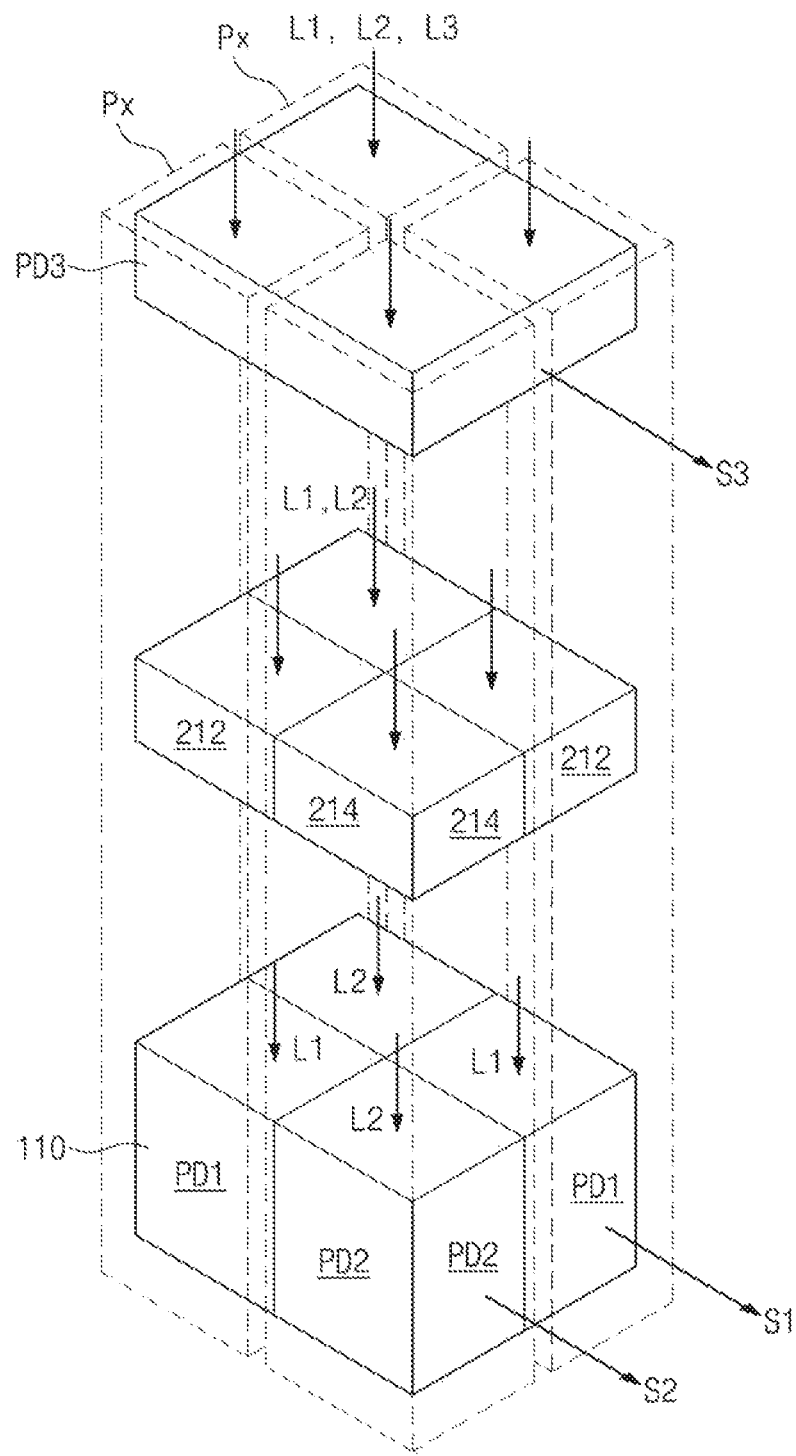
FIG. 1 is a block diagram illustrating an image sensor according to an embodiment.

FIG. 1 is a block diagram illustrating an image sensor according to an embodiment.

Referring to FIG. 1, an image sensor may include photoelectric conversion regions PD1 and PD2, color filters 212 and 214, and a photoelectric conversion layer PD3. The photoelectric conversion regions PD1 and PD2 may be provided in a substrate 110. The photoelectric conversion layer PD3 may be provided on a surface of the substrate 110, and the color filters 212 and 214 may be provided between the photoelectric conversion layer PD3 and the substrate 110.

First to third wavelength lights L1, L2, L3 may be incident into the photoelectric conversion layer PD3. The first to third wavelength lights L1, L2, L3 may have different wavelengths (e.g., first to third wavelengths). For example, the first wavelength may correspond to red color, the second wavelength light L2 may correspond to blue color, and the third wavelength may correspond to green color.

The photoelectric conversion layer PD3 may produce a third photoelectric signal S3 from the third wavelength light L3. The first wavelength light L1 and the second wavelength light L2 may transmit the photoelectric conversion layer PD3. The photoelectric conversion layer PD3 may be shared by a plurality of pixels Px.

The lights L1 and L2 passed through the photoelectric conversion layer PD3 may be incident into the color filters 212 and 214. The color filters 212 and 214 may include first color filters 212 and second color filters 214. Each of the pixels Px may include one of the first color filter 212 and the second color filter 214. The first wavelength light L1 may pass through the first color filter 212 but may not pass through the second color filter 214. The second wavelength light L2 may pass through the second color filter 214 but may not pass through the first color filter 212.

The photoelectric conversion regions PD1 and PD2 may include first photoelectric conversion regions PD1 and second photoelectric conversion regions PD2. Each of the pixels Px may include one of the first photoelectric conversion region PD1 and the second photoelectric conversion region PD2. The pixel Px including the first color filter 212 may include the first photoelectric conversion region PD1, and the pixel Px including the second color filter 214 may include the second photoelectric conversion region PD2. For example, the first photoelectric conversion region PD1 may be provided below the first color filter 212, and the second photoelectric conversion region PD2 may be provided below the second color filter 214.

Due to the first color filter 212, the first wavelength light L1 may be incident into the first photoelectric conversion region PD1. The first photoelectric conversion region PD1 may produce a first photoelectric signal S1 from the first wavelength light L1. Due to the second color filter 214, the second wavelength light L2 may be incident into the second photoelectric conversion region PD2. The second photoelectric conversion region PD2 may produce a second photoelectric signal S2 from the second wavelength light L2.

In some embodiments, since the photoelectric conversion layer PD3 is placed at a level that is not equal to (e.g., higher than) that of the photoelectric conversion regions PD1 and PD2, an integration density of an image sensor may be increased.

Figure 2A:
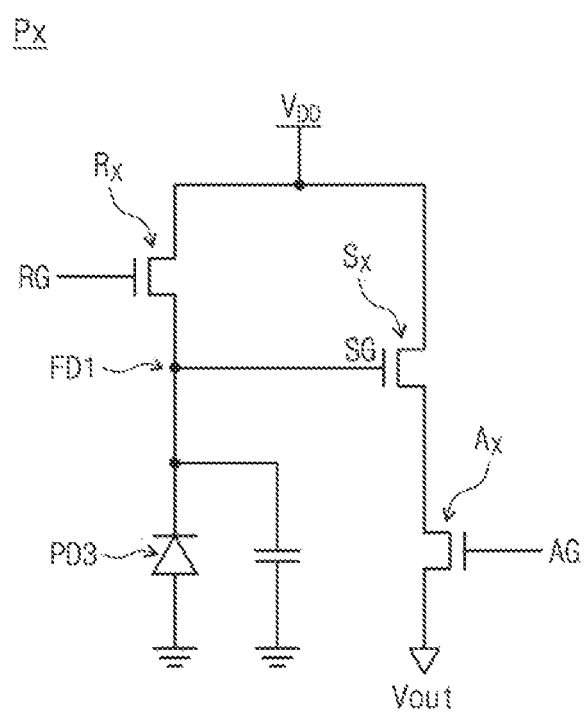
FIG. 2A is a circuit diagram illustrating an operation of a photoelectric conversion layer of an image sensor according to an embodiment.
Figure 2B:
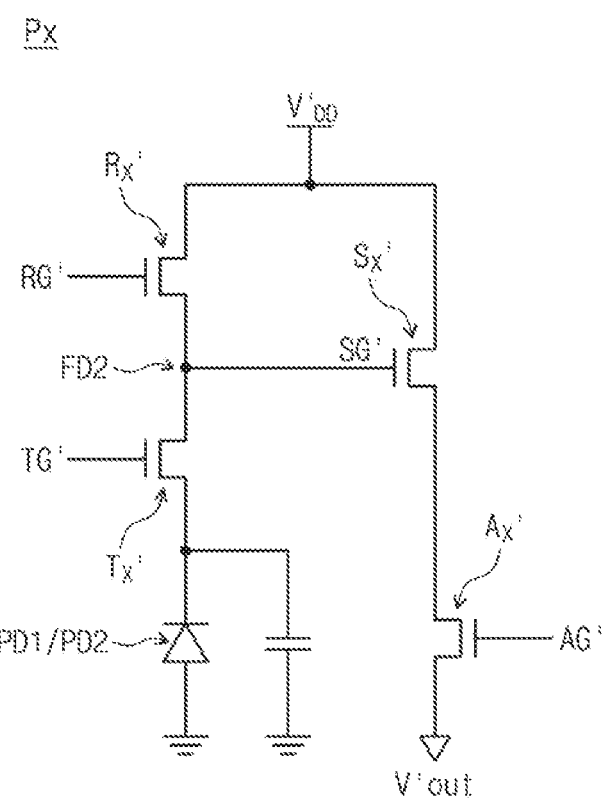
FIG. 2B is a circuit diagram illustrating an operation of a photoelectric conversion region of an image sensor according to an embodiment.

FIG. 2A is a circuit diagram illustrating an operation of a photoelectric conversion layer of an image sensor according to an embodiment. FIG. 2B is a circuit diagram illustrating an operation of a photoelectric conversion region of an image sensor according to an embodiment.

Referring to FIG. 2A, each of the pixels Px may include a first source follower transistor Sx, a first reset transistor Rx, and a first selection transistor Ax. The first source follower transistor Sx, the first reset transistor Rx, and the first selection transistor Ax may include a first source follower gate SG, a first reset gate RG, and a first selection gate AG, respectively.

A first floating diffusion region FD1 may serve as a source of the first reset transistor Rx. The first floating diffusion region FD1 may be electrically connected to the first source follower gate SG of the first source follower transistor Sx. The first source follower transistor Sx may be connected to the first selection transistor Ax.

With respect to the photoelectric conversion layer PD3, each pixel may be operated in the following manner.

First, in a light-blocking state, electric charges remaining in the first floating diffusion region FD1 may be discharged by applying a power voltage VDD to a drain of the first reset transistor Rx and a drain of the first source follower transistor Sx and turning on the first reset transistor Rx. If the electric charges remaining in the first floating diffusion region FD1 are effectively discharged, the first reset transistor Rx may be turned off.

If an external light is incident into the photoelectric conversion layer PD3, photocharges may be generated in the photoelectric conversion layer PD3. The generated photocharges may be transferred to and cumulated in the first floating diffusion region FD1. A gate bias of the first source follower transistor Sx may be changed in proportion to an amount of charges cumulated in the first floating diffusion region FD1, and this may lead to a change in source potential of the first source follower transistor Sx. Here, if the first selection transistor Ax is turned on, a signal, which is produced by light incident into the photoelectric conversion layer PD3, may be output to an output line Vout.

FIG. 2A illustrates an example in which each pixel has three transistors Rx, Sx, and Ax, but embodiments are not limited to this example. For example, the first reset transistor Rx, the first source follower transistor Sx, or the first selection transistor Ax may be shared by adjacent ones of the pixels. This makes it possible to increase an integration density of the image sensor.

FIG. 2B is a circuit diagram illustrating an operation of a photoelectric conversion region of an image sensor according to an embodiment.

Referring to FIG. 2B, each of the pixels may further include a transfer transistor Tx', a second source follower transistor Sx', a second reset transistor Rx', and a second selection transistor Ax'. The transfer transistor Tx', the second source follower transistor Sx', the second reset transistor Rx', and the second selection transistor Ax' may include a transfer gate TG', a second source follower gate SG', a second reset gate RG', and a second selection gate AG', respectively.

A second floating diffusion region FD2 may serve as a drain of the transfer transistor Tx'. The second floating diffusion region FD2 may serve as a source of the second reset transistor Rx'. The second floating diffusion region FD2 may be electrically connected to the second source follower gate SG' of the second source follower transistor Sx'. The second source follower transistor Sx' may be connected to the second selection transistor Ax'.

If an external light is incident into the photoelectric conversion region PD1 or PD2, electron-hole pairs may be generated in the photoelectric conversion region PD1 or PD2. The generated holes may be moved to and cumulated in a p-type impurity region of the photoelectric conversion region PD1 or PD2, whereas the generated electrons may be moved to and cumulated in an n-type impurity region of the photoelectric conversion region PD1 or PD2. If the transfer transistor Tx' is turned on, the generated electric charges (i.e., holes or electrons) may be transferred to and cumulated in the second floating diffusion region FD2.

Operations and functions of the second source follower transistor Sx', the second reset transistor Rx', and the second selection transistor Ax' may be substantially the same as those of the first source follower transistor Sx, the first reset transistor Rx, and the first selection transistor Ax described with reference to FIG. 2A.

In an embodiment, the second source follower transistor Sx', the second reset transistor Rx', and the second selection transistor Ax' may be provided separately from the first source follower transistor Sx, the first reset transistor Rx, and the first selection transistor Ax and may be operated independently from the first source follower transistor Sx, the first reset transistor Rx, and the first selection transistor Ax.

In certain embodiments, the photoelectric conversion region PD1 or PD2 and the photoelectric conversion layer PD3 may share the first source follower transistor Sx, the first reset transistor Rx, and/or the first selection transistor Ax described with reference to FIG. 2A. In this case, the second source follower transistor Sx', the second reset transistor Rx', or the second selection transistor Ax' may not be provided.

Figure 3:
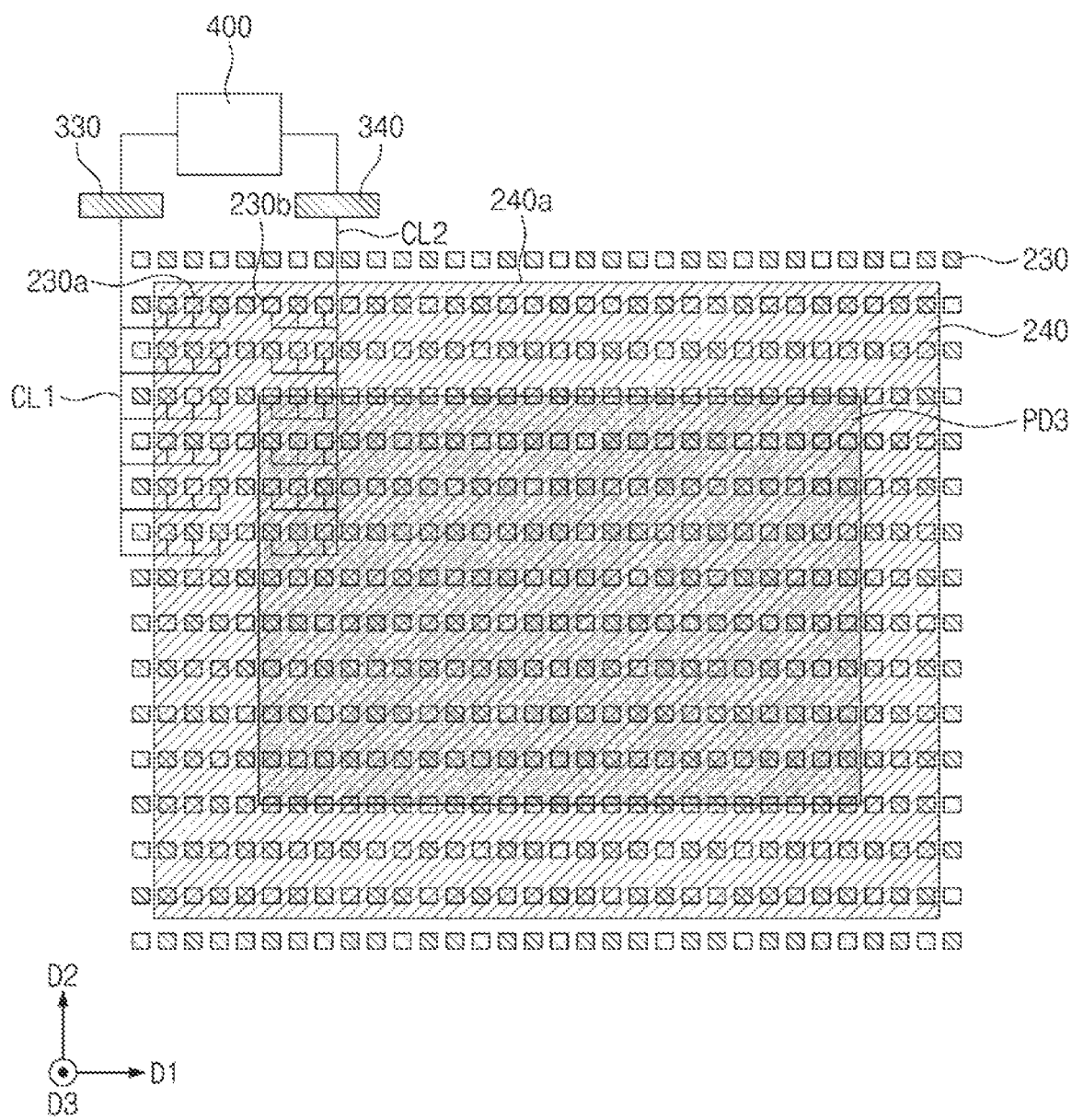
FIGS. 3 through 5 are plan views illustrating a method of measuring an image sensor according to an embodiment.
Figure 4:
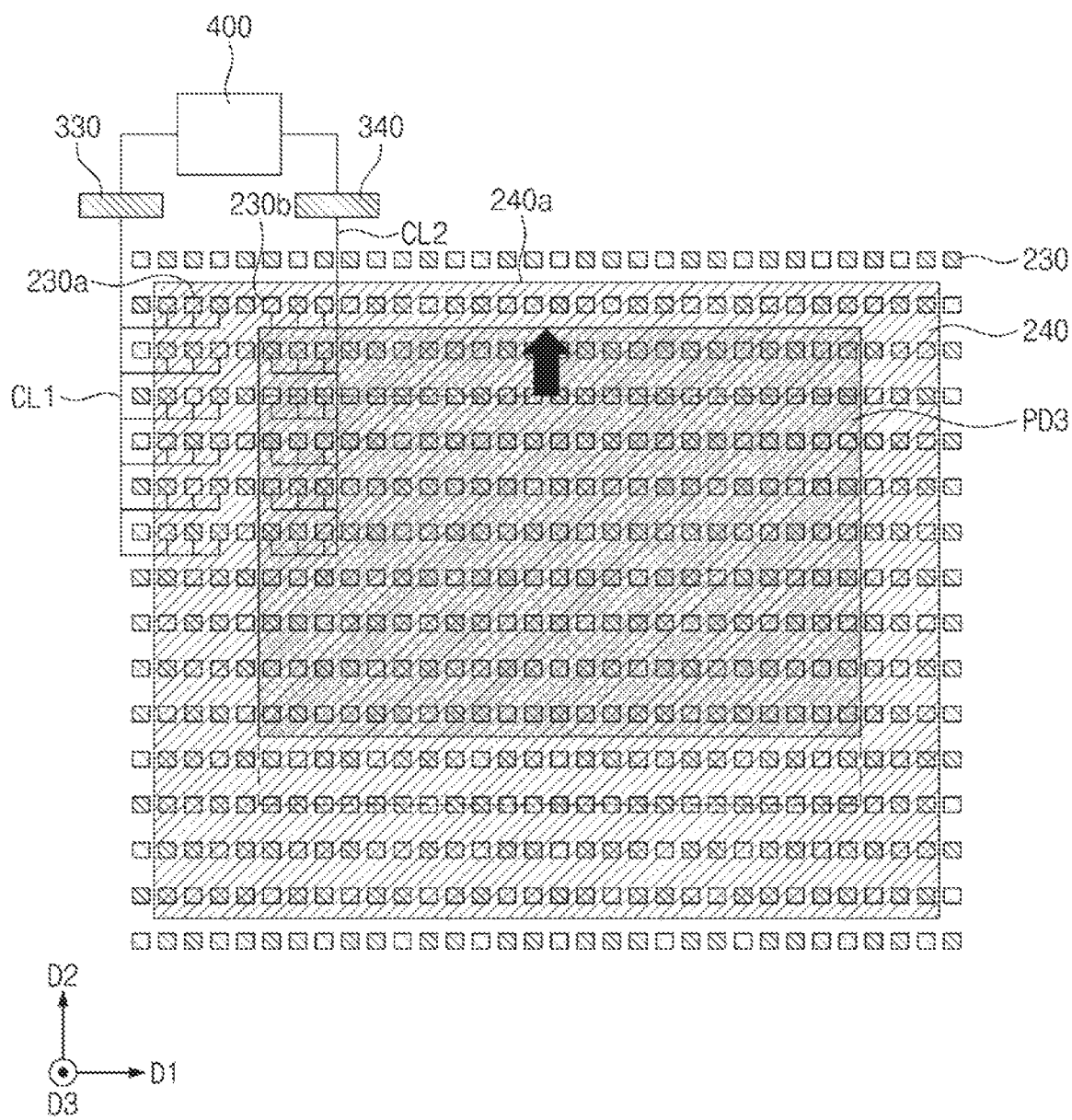
Figure 5:
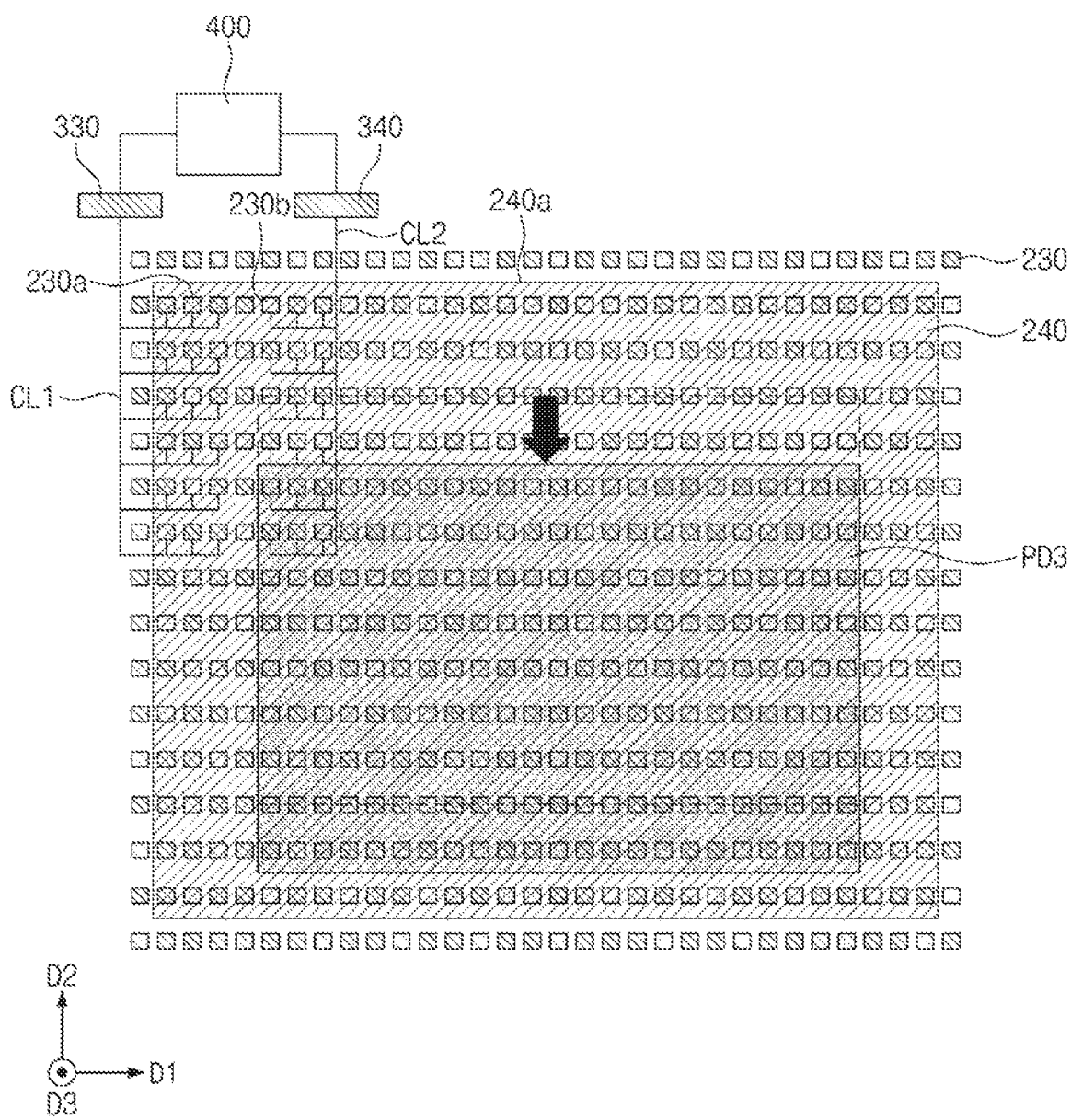

FIGS. 3 through 5 are plan views illustrating a method of measuring an image sensor according to an embodiment.

Referring to FIG. 3, an image sensor according to an embodiment may include the photoelectric conversion layer PD3, a plurality of lower electrodes 230, an upper electrode 240, a first connection line CL1, a second connection line CL2, a first pad 330, and a second pad 340.

The photoelectric conversion layer PD3 may be disposed on the lower electrodes 230. When viewed in the plan view of FIG. 3, the photoelectric conversion layer PD3 may be provided to cover some of the lower electrodes 230.

The upper electrode 240 may be disposed on the photoelectric conversion layer PD3. When viewed in the plan view of FIG. 3, the upper electrode 240 may cover the photoelectric conversion layer PD3 and some of the lower electrodes 230. A side surface of the upper electrode 240 may be defined as a first side surface 240a. The photoelectric conversion layer PD3 may be interposed between the lower electrodes 230 and the upper electrode 240.

Some of the lower electrodes 230 may be in contact with the upper electrode 240. Others of the lower electrodes 230 may be in contact with the photoelectric conversion layer PD3. Still others of the lower electrodes 230 may not be in contact with the upper electrode 240 or the photoelectric conversion layer PD3.

The number of the lower electrodes 230 in contact with the upper electrode 240, the number of the lower electrodes 230 in contact with the photoelectric conversion layer PD3, and the number of the lower electrodes 230 that are not in contact with the upper electrode 240 or the photoelectric conversion layer PD3, may vary depending on alignment states of the lower electrodes 230, the photoelectric conversion layer PD3, and the upper electrode 240.

Some of the lower electrodes 230 may be connected to the first connection line CL1. Ones of the lower electrodes 230 connected to the first connection line CL1 will be referred to as first lower electrodes 230a. The first lower electrodes 230a may be electrically connected to the first pad 330 through the first connection line CL1. The first lower electrodes 230a may be covered with the upper electrode 240. In other words, the first lower electrodes 230a may be in contact with the upper electrode 240. The first lower electrodes 230a may not be covered with the photoelectric conversion layer PD3. In other words, the first lower electrodes 230a may not be in contact with the photoelectric conversion layer PD3.

Some of the lower electrodes 230 may be connected to the second connection line CL2. Ones of the lower electrodes 230 connected to the second connection line CL2 will be referred to as second lower electrodes 230b. The second lower electrodes 230b may be electrically connected to the second pad 340 through the second connection line CL2. The second lower electrodes 230b may be covered with the upper electrode 240. Some of the second lower electrodes 230b may be in contact with the upper electrode 240, and the others may not be in contact with the upper electrode 240. The others of the second lower electrodes 230b may not be in contact with the upper electrode 240 by the photoelectric conversion layer PD3. Some of the second lower electrodes 230b may be covered with the photoelectric conversion layer PD3. In other words, some of the second lower electrodes 230b may be in contact with the photoelectric conversion layer PD3.

The number of the second lower electrodes 230b in contact with the upper electrode 240 may vary depending on the alignment states of the lower electrodes 230, the photoelectric conversion layer PD3, and the upper electrode 240. For example, in the case where the upper electrode 240 and the lower electrodes 230 are fixed, the smaller a distance between the photoelectric conversion layer PD3 and the first side surface 240a of the upper electrode 240, the smaller the number of the second lower electrodes 230b in contact with the upper electrode 240.

A measurement unit 400 may be connected to the first and second pads 330 and 340. As an example, the measurement unit 400 may include at least one resistor and a voltage source. The measurement unit 400 may be used to produce an electric current, which sequentially flows through the first pad 330, the first lower electrodes 230a, the upper electrode 240, the second lower electrodes 230b, and the second pad 340. In certain embodiments, the measurement unit 400 may be used to produce an electric current, which sequentially flows through the second pad 340, the second lower electrodes 230b, the upper electrode 240, the first lower electrodes 230a, and the first pad 330.

The measurement unit 400 may measure an amount of the current to examine or count the number of the second lower electrodes 230b in contact with the upper electrode 240. In detail, if the amount of the current is large, this means that the number of the second lower electrodes 230b in contact with the upper electrode 240 is large, and if the amount of the current is small, this means that the number of the second lower electrodes 230b in contact with the upper electrode 240 is small. The measurement information on the number of the second lower electrodes 230b in contact with the upper electrode 240 may be used to examine an alignment state of the upper electrode 240 and the photoelectric conversion layer PD3. If, from the measurement, the lower electrodes 230, the photoelectric conversion layer PD3, and the upper electrode 240 are examined to be misaligned, the alignment state between the photoelectric conversion layer PD3 and the upper electrode 240 may be adjusted.

In the present embodiment, the measurement information on the number of the second lower electrodes 230b in contact with the upper electrode 240 is used to examine the alignment state, but embodiments are not limited to this example.

As an example, the numbers of the first lower electrodes 230a and the second lower electrodes 230b in contact with the upper electrode 240 may vary depending on an alignment state of the upper electrode 240 and the photoelectric conversion layer PD3. In this case, an amount of the current measured by the measurement unit 400 may be used to examine or count the numbers of the first lower electrodes 230a and the second lower electrodes 230b in contact with the upper electrode 240 and consequently to examine an alignment state of the upper electrode 240 and the photoelectric conversion layer PD3.

The photoelectric conversion layer PD3 of the image sensor of FIG. 3 may be aligned to a predetermined position. In other words, a position of the photoelectric conversion layer PD3 of FIG. 3 may be defined as a reference state.

The photoelectric conversion layer PD3 of the image sensor of FIG. 4 may be offset from the reference state of FIG. 3 in the second direction D2. In other words, the photoelectric conversion layer PD3 of FIG. 4 may be misaligned from the reference state in the second direction D2. The photoelectric conversion layer PD3 of FIG. 4 may be defined as a first misalignment state.

The photoelectric conversion layer PD3 of the image sensor of FIG. 5 may be offset from the reference state of FIG. 3 in a direction opposite to the second direction D2. In other words, the photoelectric conversion layer PD3 of FIG. 5 may be misaligned in the direction opposite to the second direction D2. The photoelectric conversion layer PD3 of FIG. 5 may be defined as a second misalignment state.

Figure 6A:
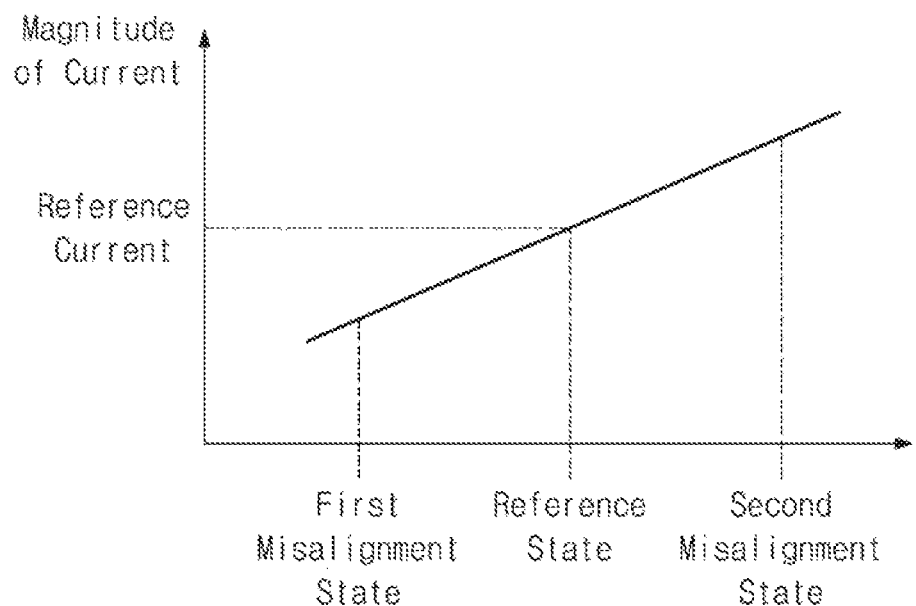
FIG. 6A is a graph showing electric current measured from each of the image sensors of FIGS. 3 through 5, using a measurement unit.
Figure 6B:
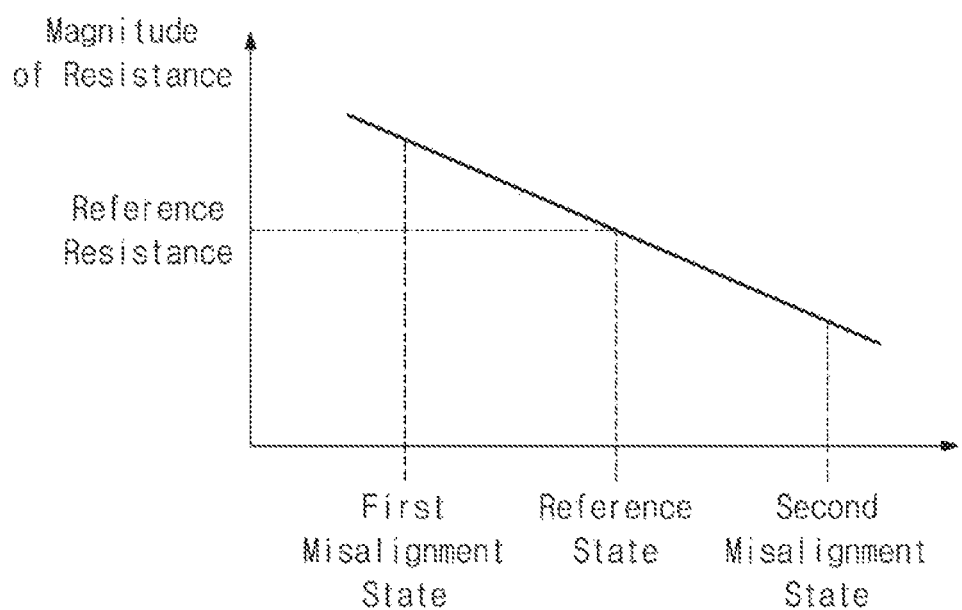
FIG. 6B is a graph showing resistance measured from each of the image sensors of FIGS. 3 through 5, using a measurement unit.

Current and resistance measured from each of the image sensors of FIGS. 3, 4, and 5 using the measurement unit 400 are shown in FIGS. 6A and 6B, respectively.

Referring to FIGS. 6A and 6B, the magnitude of the current was smaller in the first misalignment state of FIG. 4 than in the reference state of FIG. 3. The magnitude of the resistance was higher in the first misalignment state of FIG. 4 than in the reference state of FIG. 3. This is because the number of the second lower electrodes 230b in contact with the upper electrode 240 is smaller in the first misalignment state than in the reference state. That is, if the magnitude of the current measured by the measurement unit 400 is smaller than a reference current, the photoelectric conversion layer PD3 may be evaluated to be misaligned in the second direction D2. If the magnitude of the resistance measured by the measurement unit 400 is greater than a reference resistance, the photoelectric conversion layer PD3 may be evaluated to be misaligned in the second direction D2.

The magnitude of the current may be greater in the second misalignment state of FIG. 5 than in the reference state of FIG. 3. The magnitude of the resistance may be smaller in the second misalignment state of FIG. 5 than in the reference state of FIG. 3. This is because the number of the second lower electrodes 230b in contact with the upper electrode 240 is greater in the second misalignment state than in the reference state. That is, if the magnitude of the current measured by the measurement unit 400 is greater than a reference current, the photoelectric conversion layer PD3 may be evaluated to be misaligned in the opposite direction of the second direction D2. If the magnitude of the resistance measured by the measurement unit 400 is smaller than a reference resistance, the photoelectric conversion layer PD3 may be evaluated to be misaligned in the opposite direction of the second direction D2.

Figure 7:
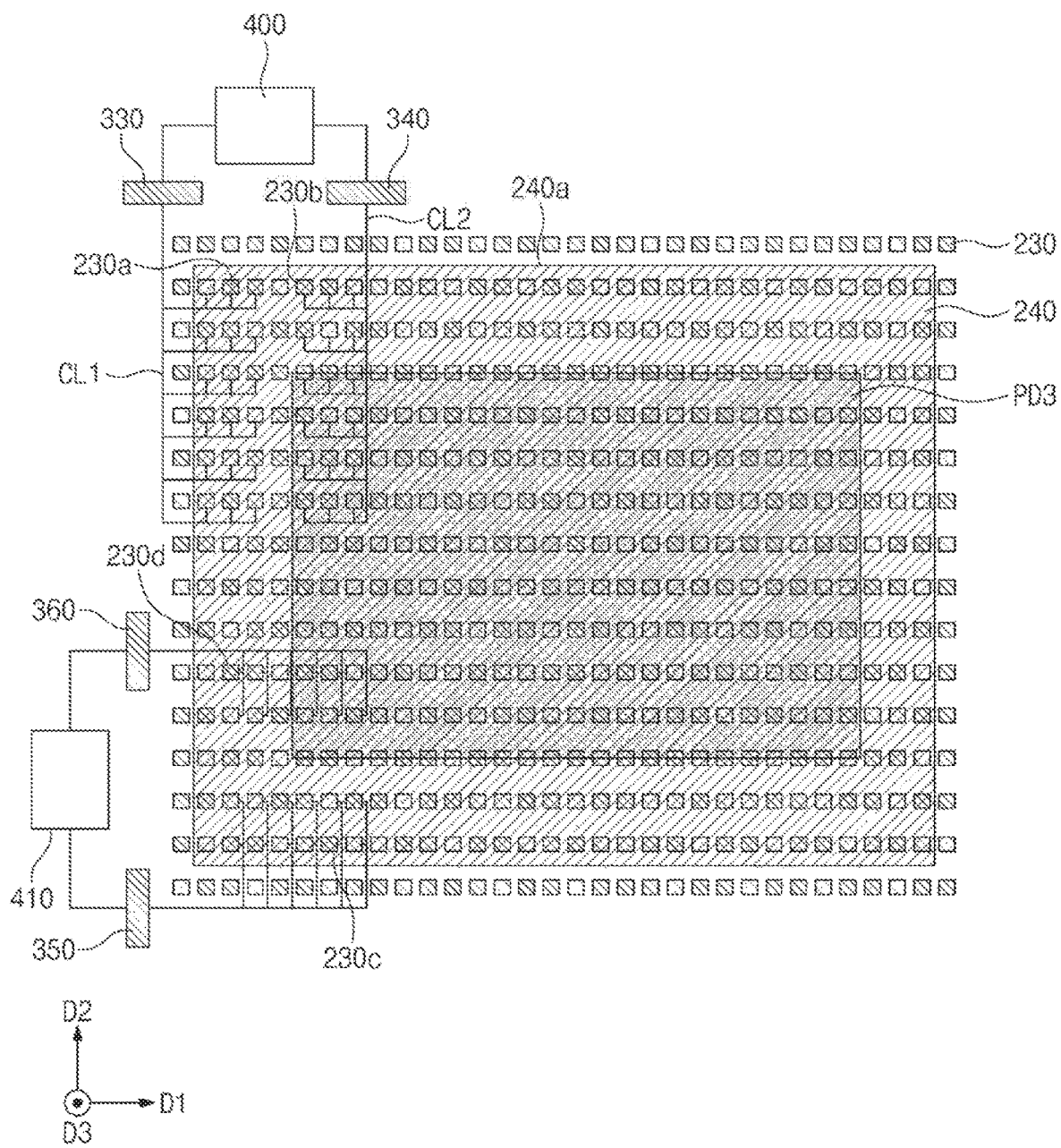
FIG. 7 is a plan view illustrating a method of measuring an image sensor according to another embodiment.

FIG. 7 is a plan view illustrating a method of measuring an image sensor according to another embodiment.

Referring to FIG. 7, a third pad 350 electrically connected to third lower electrodes 230c and a fourth pad 360 electrically connected to fourth lower electrodes 230d may be further provided. the third pad 350 may be electrically connected to the third lower electrodes 230c arranged in the first direction D1. The fourth pad 360 may be electrically connected to the fourth lower electrodes 230d arranged in the first direction D1. An additional measurement unit 410 connected to the third and fourth pads 350 and 360 may be provided. Thus, the additional measurement unit 410 may be used to measure the misalignment of the photoelectric conversion layer PD3 in the first direction D1, and as described above, the measurement unit 400 may be used to measure the misalignment of the photoelectric conversion layer PD3 in the second direction D2.

Figure 8:
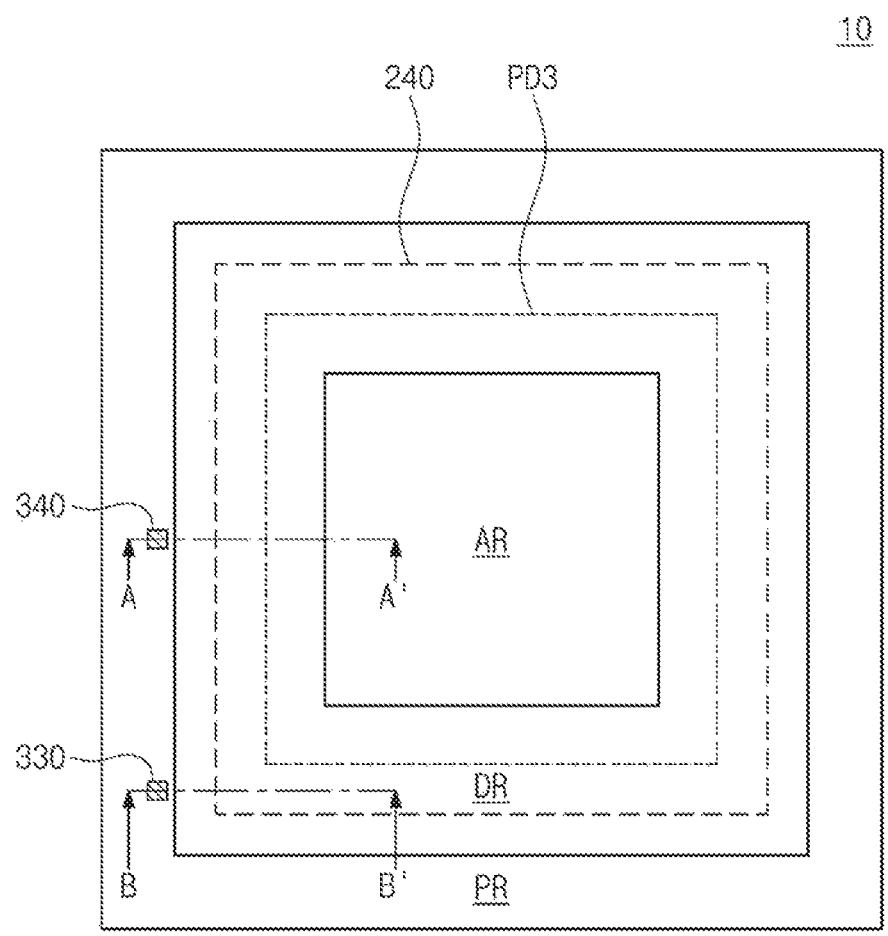
FIG. 8 is a plan view illustrating an image sensor according to an embodiment.
Figure 9A:
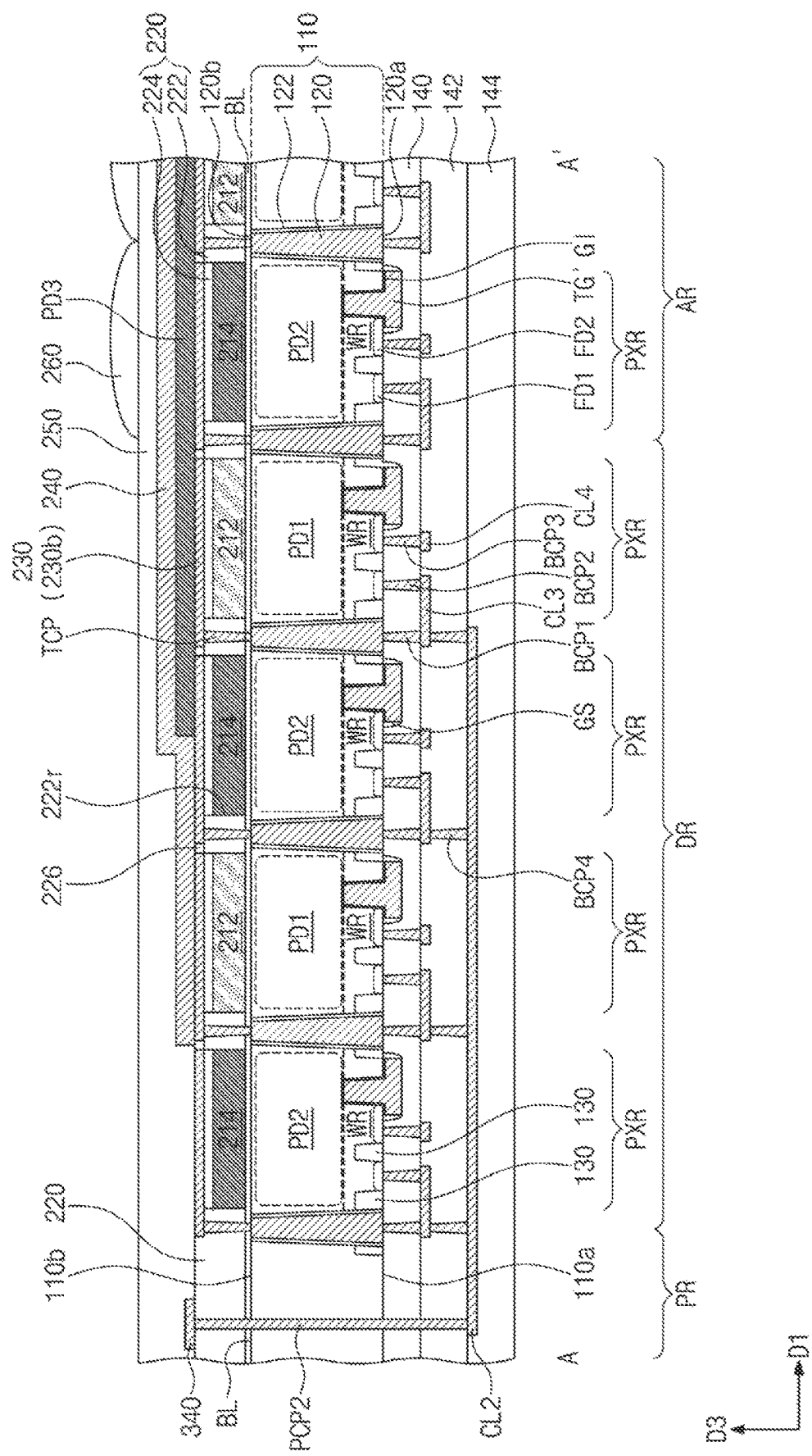
FIG. 9A is a sectional view taken along a line A-A' of FIG. 8.
Figure 9B:
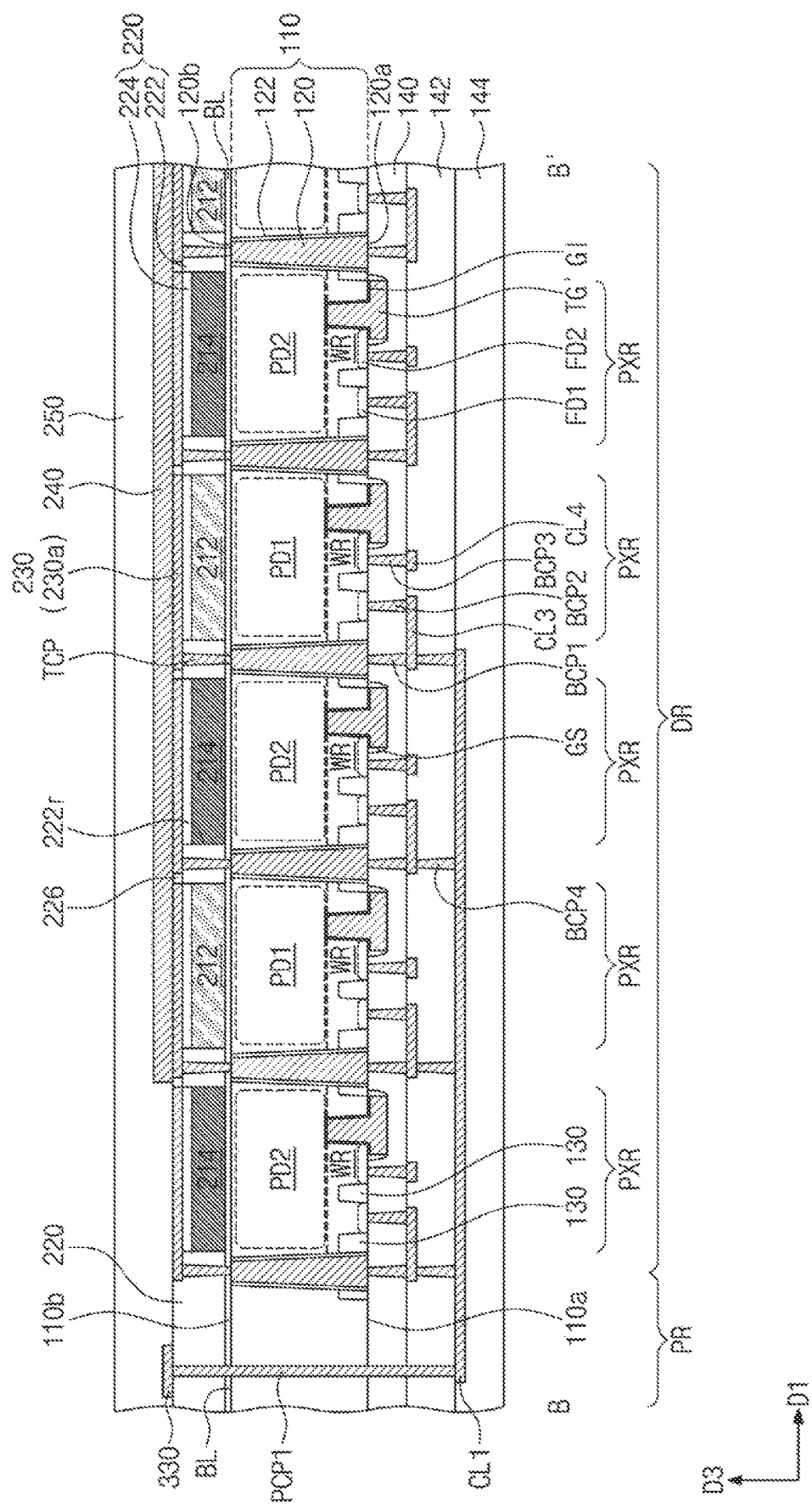
FIG. 9B is a sectional view taken along a line B-B' of FIG. 8.

FIG. 8 is a plan view illustrating an image sensor according to an embodiment. FIG. 9A is a sectional view taken along a line A-A' of FIG. 8. FIG. 9B is a sectional view taken along a line B-B' of FIG. 8.

Referring to FIGS. 8, 9A, and 9B, when viewed in a plan view, an image sensor 10 may include pixel array regions AR and DR and a peripheral region PR surrounding the pixel array regions AR and DR. When viewed in a plan view, the pixel array regions AR and DR may include an active region AR, which is located at a center of the image sensor, and a dummy region DR, which is provided to enclose the active region AR. When viewed in a plan view, the dummy region DR may be positioned between the active region AR and the peripheral region PR. The active region AR may be a region, in which active pixels are disposed, and the dummy region DR may be a region, in which dummy pixels are disposed. The active pixels may correspond to the pixels Px described with reference to FIGS. 1, 2A, and 2B. The dummy pixels may have a structure similar to the active pixels but may not have the same function (i.e., an operation of producing photoelectric signals from incident light) as the active pixels. The peripheral region PR may be a region, in which a peripheral circuit is disposed.

The image sensor 10 may include the substrate 110. The substrate 110 may be extended from the active region AR to the dummy region DR and the peripheral region PR. The substrate 110 may have a first surface 110a and a second surface 110b facing each other. The first surface 110a of the substrate 110 may be a front surface, and the second surface 110b of the substrate 110 may be a rear surface. For example, the substrate 110 may be a bulk silicon substrate, a silicon-on-insulator (SOI) substrate, or a semiconductor epitaxial layer. The substrate 110 may have a first conductivity type (e.g., p-type).

The substrate 110 in the active region AR and the dummy region DR may include a plurality of pixel regions PXR, which are two-dimensionally arranged. For example, the pixel regions PXR may be two-dimensionally arranged in a first direction D1 and a second direction D2 crossing each other. The substrate 110 in the peripheral region PR may not include the pixel region PXR.

Penetration electrodes 120 may be provided in the substrate 110 of the active region AR and the dummy region DR. The penetration electrodes 120 may include a conductive material. In an embodiment, the penetration electrodes 120 may include a poly silicon layer, which is doped with n- or p-type dopants. For example, a concentration of the n- or p-type dopants in the penetration electrodes 120 may be higher than $10^{19}/cm^3$.

When viewed in a plan view, the penetration electrodes 120 may be disposed between the pixel regions PXR. For example, the penetration electrodes 120 may be disposed between the pixel regions PXR adjacent to each other in the first direction D1. Thus, the penetration electrodes 120 and the pixel regions PXR may be alternately arranged in the first direction D1.

Each of the penetration electrodes 120 may be extended in a third direction D3 perpendicular to the first surface 110*a* of the substrate 110. An end 120*b* of each of the penetration electrodes 120 may be substantially coplanar with the second surface 110*b* of the substrate 110. An opposite end 120*a* of each of the penetration electrodes 120 may be substantially coplanar with the first surface 110*a* of the substrate 110. When viewed in a sectional view, a width of each of the penetration electrodes 120 may decrease with decreasing distance from the second surface 110*b* of the substrate 110.

An insulating penetration pattern 122 may be provided between a side surface of each of the penetration electrodes 120 and the substrate 110. The insulating penetration pattern 122 may be formed of or include at least one of, for example, silicon oxide, silicon nitride, and/or silicon oxynitride.

As an example, first device isolation patterns (not shown) may be provided in the substrate 110. Each of the first device isolation patterns may be a deep device isolation pattern, which is extended from the first surface 110*a* of the substrate 110 to the second surface 110*b*. The first device isolation patterns may be disposed between the pixel regions PXR. As another example, the first device isolation patterns may not be provided.

Second device isolation patterns 130 may be provided in the substrate 110. The second device isolation patterns 130 may be shallow device isolation patterns formed on the first surface 110*a* of the substrate 110. A depth of the second device isolation patterns 130 may be smaller than a depth of the first device isolation patterns.

The second device isolation patterns 130 may define a device active region in each of the pixel regions PXR. The device active region may be a region for operations of transistors disposed on the first surface 110*a* of the substrate 110. The transistors may include, for example, the transistors Rx, Sx, Ax, Tx', Rx', Sx', and/or Ax' described with reference to FIGS. 2A and 2B. The second device isolation pattern 130 may be formed of or include at least one of, for example, silicon oxide, silicon nitride, and/or silicon oxynitride.

The photoelectric conversion regions PD1 and PD2 may be provided in the substrate 110 of the active region AR and the dummy region DR. In detail, the photoelectric conversion region PD1 or PD2 may be provided in each of the pixel regions PXR of the substrate 110. The photoelectric conversion regions PD1 and PD2 may include the first photoelectric conversion regions PD1 and the second photoelectric conversion regions PD2. The first photoelectric conversion regions PD1 may correspond to the first photoelectric conversion regions PD1 described with reference to FIG. 1, and the second photoelectric conversion regions PD2 may correspond to the second photoelectric conversion regions PD2 described with reference to FIG. 1. The first and second photoelectric conversion regions PD1 and PD2 may be two-dimensionally arranged and may be alternately arranged, when viewed in a plan view.

The photoelectric conversion regions PD1 and PD2 may be impurity regions, which are doped with of impurities and are of a second conductivity type (e.g., n-type) different from the first conductivity type (e.g., p-type). That is, the photoelectric conversion regions PD1 and PD2 may have the second conductivity type. In an embodiment, to realize a gradient in potential between the first and second surfaces 110*a* and 110*b* of the substrate 110, each of the photoelectric conversion regions PD1 and PD2 may be formed to have a difference in doping concentration between two portions, which are positioned adjacent to the first surface 110*a* and the second surface 110*b*, respectively. For example, each of the photoelectric conversion regions PD1 and PD2 may include a plurality of impurity regions, which are vertically stacked.

Well impurity regions WR may be provided in the substrate 110 of the active region AR and the dummy region DR. For example, the well impurity region WR may be disposed in the pixel regions PXR of the substrate 110. Each of the well impurity regions WR may be adjacent to the first surface 110*a* of the substrate 110. Accordingly, in each of the pixel regions PXR, the well impurity region WR may be positioned between the photoelectric conversion region PD1 or PD2 and the first surface 110*a* of the substrate 110. In other words, in each of the pixel regions PXR, the photoelectric conversion region PD1 or PD2 may be positioned between the well impurity region WR and the second surface 110*b* of the substrate 110.

The well impurity regions WR may be regions, which are doped with impurities of the first conductivity type (e.g., p-type). Thus, the well impurity regions WR may have the first conductivity type.

The first floating diffusion regions FD1 and the second floating diffusion regions FD2 may be provided in the substrate 110 of the active region AR and the dummy region DR. In detail, a pair of the first and second floating diffusion regions FD1 and FD2 may be provided in each of the pixel regions PXR of the substrate 110. Each of the first floating diffusion regions FD1 may correspond to the first floating diffusion region FD1 described with reference to FIG. 2A, and each of the second floating diffusion regions FD2 may correspond to the second floating diffusion region FD2 described with reference to FIG. 2B.

In each of the pixel regions PXR, the pair of the first and second floating diffusion regions FD1 and FD2 may be positioned in the well impurity region WR and adjacent to the first surface 110*a* of the substrate 110. In each of the pixel regions PXR, the pair of the first and second floating diffusion regions FD1 and FD2 may be spaced apart from each other, and the second device isolation pattern 130 may be interposed therebetween.

The first floating diffusion regions FD1 and the second floating diffusion regions FD2 may be regions, which are doped with impurities of the second conductivity type (e.g., n-type). Thus, the first floating diffusion regions FD1 and the second floating diffusion regions FD2 may have the second conductivity type.

The transfer gates TG' may be provided on the first surface 110*a* of the substrate 110 and in the active region AR and the dummy region DR. The transfer gates TG' may be disposed to correspond to the pixel regions PXR, respectively. One of the second floating diffusion regions FD2 may be positioned at a side of each of the transfer gates TG'.

Each of the transfer gates TG' may include a lower portion inserted into the substrate 110 and an upper portion, which is connected to the lower portion and has a shape protruding above the first surface 110*a* of the substrate 110. Each of the transfer gates TG' may correspond to the transfer gates TG' described with reference to FIG. 2B.

A gate insulating pattern GI may be provided between each of the transfer gates TG' and the substrate 110. A gate spacer GS may be provided on a side surface of the upper portion of each of the transfer gates TG'. For example, each of the gate insulating pattern GI and the gate spacer GS may include at least one of silicon oxide, silicon nitride, and/or silicon oxynitride.

A first source follower gate (not shown), a first reset gate (not shown), a first selection gate (not shown), a second source follower gate (not shown), a second reset gate (not shown), and/or a second selection gate (not shown) may be provided on the first surface 110a of the substrate 110 and in the active region AR and the dummy region DR. For example, the gates may be disposed on the first surface 110a of the pixel regions PXR. The gates may be configured to perform substantially the same function and/or operation as those described with reference to FIGS. 2A and 2B.

A first interlayered insulating layer 140 may be provided on the first surface 110a of the substrate 110. The first interlayered insulating layer 140 may be extended from the active region AR to the dummy region DR and the peripheral region PR. The first interlayered insulating layer 140 may cover the gates (e.g., the transfer gates TG') provided on the first surface 110a of the substrate 110. The first interlayered insulating layer 140 may be formed of or include at least one of, for example, silicon oxide, silicon nitride, and/or silicon oxynitride.

First lower contact plugs BCP1 may be provided to penetrate the first interlayered insulating layer 140 and to be connected to the penetration electrodes 120, respectively. When viewed in a sectional view, a width of each of the first lower contact plugs BCP1 may be smaller than the width of each of the penetration electrodes 120. When viewed in a sectional view, the width of each of the first lower contact plugs BCP1 may decrease with decreasing distance from a corresponding one of the penetration electrodes 120 connected thereto.

Second lower contact plugs BCP2 may be provided to penetrate the first interlayered insulating layer 140 and to be connected to the first floating diffusion regions FD1, respectively, and third lower contact plugs BCP3 may be provided to penetrate the first interlayered insulating layer 140 and to be connected to the second floating diffusion regions FD2, respectively. A width of each of the second lower contact plugs BCP2 and a width of each of the third lower contact plugs BCP3 may decrease with decreasing distance from the first surface 110a of the substrate 110.

Lengths of the first to third lower contact plugs BCP1, BCP2, and BCP3 in the third direction D3 may be substantially the same. The first to third lower contact plugs BCP1, BCP2, and BCP3 may include a conductive material. For example, the first to third lower contact plugs BCP1, BCP2, and BCP3 may include a metal (e.g., tungsten).

Third connection lines CL3 may be provided on the first interlayered insulating layer 140. Each of the third connection lines CL3 may connect a corresponding pair of the first and second lower contact plugs BCP1 and BCP2 to each other. Each of the penetration electrodes 120 may be electrically connected to the first floating diffusion region FD1 through the first lower contact plug BCP1, third connection line CL3, and the second lower contact plug BCP2.

Fourth connection lines CL4 may be provided on the first interlayered insulating layer 140. The fourth connection lines CL4 may be connected to the third lower contact plugs BCP3, respectively.

The third and fourth connection lines CL3 and CL4 may include a conductive material. For example, the third and fourth connection lines CL3 and CL4 may include a metal (e.g., tungsten).

A second interlayered insulating layer 142 may be provided on the first interlayered insulating layer 140. The second interlayered insulating layer 142 may be extended from the active region AR to the dummy region DR and the peripheral region PR. The second interlayered insulating layer 142 may cover the third and fourth connection lines CL3 and CL4. The second interlayered insulating layer 142 may be formed of or include at least one of, for example, silicon oxide, silicon nitride, and/or silicon oxynitride.

Fourth lower contact plugs BCP4 may be provided to penetrate the second interlayered insulating layer 142 of the dummy region DR and may be connected to the third connection lines CL3, respectively. When viewed in a sectional view, a width of each of the fourth lower contact plugs BCP4 may decrease with decreasing distance from a corresponding one of the third connection lines CL3 connected thereto. The fourth lower contact plug BCP4 may include a conductive material. For example, the fourth lower contact plug BCP4 may include a metal (e.g., tungsten).

The first connection line CL1 may be provided on the second interlayered insulating layer 142 of the dummy region DR and the peripheral region PR. The first connection line CL1 may correspond to the first connection line CL1 described with reference to FIG. 3. The first connection line CL1 may be extended from the dummy region DR to the peripheral region PR. The first connection line CL1 may be connected to the fourth lower contact plugs BCP4 in the dummy region DR.

The second connection line CL2 may be provided on the second interlayered insulating layer 142 of the dummy region DR and the peripheral region PR. The second connection line CL2 may correspond to the second connection line CL2 described with reference to FIG. 3. The second connection line CL2 may be extended from the dummy region DR to the peripheral region PR. The second connection line CL2 may be connected to the fourth lower contact plugs BCP4 in the dummy region DR.

The first and second connection lines CL1 and CL2 may be parallel to each other. The first and second connection lines CL1 and CL2 may be spaced apart from each other in the second direction D2. The first and second connection lines CL1 and CL2 may include a conductive material. For example, the first and second connection lines CL1 and CL2 may include a metal (e.g., tungsten).

A third interlayered insulating layer 144 may be provided on the second interlayered insulating layer 142. The third interlayered insulating layer 144 may be extended from the active region AR to the dummy region DR and the peripheral region PR. The third interlayered insulating layer 144 may cover the first and second connection lines CL1 and CL2. The third interlayered insulating layer 144 may be formed of or include at least one of, for example, silicon oxide, silicon nitride, and/or silicon oxynitride.

A buffer layer BL may be provided on the second surface 110b of the substrate 110. The buffer layer BL may be extended from the active region AR to the dummy region DR and the peripheral region PR. The buffer layer BL may be configured to prevent or suppress electric charges (i.e., electrons or holes), which may be produced by defects of the second surface 110b of the substrate 110, from entering the photoelectric conversion regions PD1 and PD2. The buffer layer BL may include a metal oxide material. For example, the buffer layer BL may include aluminum oxide and/or hafnium oxide.

An insulating structure 220 may be provided on the buffer layer BL. The insulating structure 220 may be extended from the active region AR to the dummy region DR and the peripheral region PR. The color filters 212 and 214 may be buried in the insulating structure 220 of the active region AR and the dummy region DR. The insulating structure 220 may be formed of or include at least one of, for example, silicon oxide, silicon nitride, and/or silicon oxynitride.

In an embodiment, the insulating structure 220 may include a first insulating pattern 222, which is provided to define recess regions 222r in the active region AR and the dummy region DR. When viewed in a plan view, the recess regions 222r of the first insulating pattern 222 may correspond to the pixel regions PXR of the substrate 110. The recess regions 222r may be provided to expose the buffer layer BL.

The color filters 212 and 214 may include the first color filters 212 and the second color filters 214. The first color filters 212 may correspond to the first color filters 212 described with reference to FIG. 1, and the second color filters 214 may correspond to the second color filters 214 described with reference to FIG. 1. One of the first color filter 212 and the second color filter 214 may be disposed in each of the recess regions 222r. When viewed in a plan view, the first color filters 212 may be disposed to correspond to the first photoelectric conversion regions PD1, and the second color filters 214 may be disposed to correspond to the second photoelectric conversion regions PD2.

As described with reference to FIGS. 1 and 2B, the first color filter 212 may be configured to transmit the first wavelength light L1. The first photoelectric conversion region PD1 may generate electric charges (i.e., electron-hole pairs) from the first wavelength light L1. If the transfer transistor Tx' is turned on, the generated electric charges (i.e., holes or electrons) may be transferred to and cumulated in the second floating diffusion region FD2. The second color filter 214 may transmit the second wavelength light L2. The second photoelectric conversion region PD2 may generate electric charges (i.e., electron-hole pairs) from the second wavelength light L2. If the transfer transistor Tx' is turned on, the generated electric charges (i.e., holes or electrons) may be transferred to and cumulated in the second floating diffusion region FD2.

The insulating structure 220 may further include second insulating patterns 224 provided on the color filters 212 and 214 and in the active region AR and the dummy region DR. The second insulating patterns 224 may be provided in the recess regions 222r, respectively, and may be spaced apart from each other.

Upper contact plugs TCP may be provided in the active region AR and the dummy region DR to penetrate the first insulating pattern 222 of the insulating structure 220 and the buffer layer BL and to be connected to the penetration electrodes 120, respectively. When viewed in a sectional view, a width of each of the upper contact plugs TCP may be smaller than a width of each of the penetration electrodes 120. When viewed in a sectional view, a width of each of the upper contact plugs TCP may decrease with decreasing distance from the penetration electrode 120 connected thereto (or from the second surface 110b of the substrate 110). The upper contact plugs TCP may include a conductive material. For example, the upper contact plugs TCP may include a metal (e.g., tungsten).

The lower electrodes 230 may be provided on the insulating structure 220 of the active region AR and the dummy region DR. The lower electrodes 230 may correspond to the lower electrodes 230 described with reference to FIG. 3. When viewed in a plan view, the lower electrodes 230 may be provided to correspond to the pixel regions PXR, respectively, of the substrate 110 and may be spaced apart from each other. Each of the lower electrodes 230 may be connected to a corresponding one of the upper contact plugs TCP.

Each of the lower electrodes 230 may be electrically connected to the first floating diffusion region FD1 through the upper contact plug TCP, the penetration electrode 120, the first lower contact plug BCP1, the third connection line CL3, and the second lower contact plug BCP2.

The lower electrodes 230 may include the first lower electrodes 230a and the second lower electrodes 230b. The first lower electrodes 230a may correspond to the first lower electrodes 230a described with reference to FIG. 3. The second lower electrodes 230b may correspond to the second lower electrodes 230b described with reference to FIG. 3.

The lower electrodes 230 may include a transparent conductive material. For example, the lower electrodes 230 may include indium-tin oxide (ITO), indium-zinc oxide (IZO), zinc oxide (ZnO), and/or organic transparent conductive materials.

A third insulating pattern 226 may be provided to fill a gap between the lower electrodes 230. A top surface of the third insulating pattern 226 may be substantially coplanar with a top surface of the lower electrodes 230. The third insulating pattern 226 may be formed of or include at least one of, for example, silicon oxide, silicon nitride, and/or silicon oxynitride.

A first pad contact plug PCP1 may be provided in the peripheral region PR to penetrate the second interlayered insulating layer 142, the first interlayered insulating layer 140, the substrate 110, the buffer layer BL, and the insulating structure 220 and to be connected to the first connection line CL1.

A second pad contact plug PCP2 may be provided in the peripheral region PR to penetrate the second interlayered insulating layer 142, the first interlayered insulating layer 140, the substrate 110, the buffer layer BL, and the insulating structure 220 and to be connected to the second connection line CL2.

When viewed in a sectional view, widths of the first and second pad contact plugs PCP1 and PCP2 may decrease with decreasing distance from the first connection line CL1 or the second connection line CL2 connected thereto. The first and second pad contact plugs PCP1 and PCP2 may include a conductive material. For example, the first and second pad contact plugs PCP1 and PCP2 may include a metal (e.g., tungsten).

The first pad 330 may be provided on the insulating structure 220 of the peripheral region PR. The first pad 330 may correspond to the first pad 330 described with reference to FIG. 3. The first pad 330 may be connected to the first connection line CL1 through the first pad contact plug PCP1.

Each of the first lower electrodes 230a may be electrically connected to the first pad 330 through the upper contact plug TCP, the penetration electrode 120, the first lower contact plug BCP1, the third connection line CL3, the fourth lower contact plug BCP4, the first connection line CL1 and the first pad contact plug PCP1.

The second pad 340 may be provided on the insulating structure 220 of the peripheral region PR. The second pad 340 may correspond to the second pad 340 described with reference to FIG. 3. The second pad 340 may be connected to the second connection line CL2 through the second pad contact plug PCP2.

Each of the second lower electrodes 230b may be electrically connected to the second pad 340 through the upper contact plug TCP, the penetration electrode 120, the first lower contact plug BCP1, the third connection line CL3, the fourth lower contact plug BCP4, the second connection line CL2, and the second pad contact plug PCP2.

The first and second pads 330 and 340 may be spaced apart from each other in the second direction D2. The first and second pads 330 and 340 may be provided on the same plane. The first and second pads 330 and 340 and a portion of the upper electrode 240 may be provided on the same plane. In other words, the first and second pads 330 and 340 may be provided on the same plane as portions of the upper electrode 240 in contact with the first and second lower electrodes 230a and 230b.

The photoelectric conversion layer PD3 may be provided on the lower electrodes 230. The photoelectric conversion layer PD3 may correspond to the photoelectric conversion layer PD3 described with reference to FIGS. 1, 2A, and 3. When viewed in a plan view, the photoelectric conversion layer PD3 may cover the active region AR and may cover a portion of the dummy region DR. When viewed in a plan view, the photoelectric conversion layer PD3 may expose a portion of the dummy region DR and may expose the peripheral region PR. The photoelectric conversion layer PD3 may be in contact with the lower electrodes 230 of the active region AR and may be in contact with some of the lower electrodes 230 of the dummy region DR. The photoelectric conversion layer PD3 may not be in contact with the first lower electrodes 230a. The photoelectric conversion layer PD3 may be in contact with some of the second lower electrodes 230b.

As an example, the photoelectric conversion layer PD3 may include an organic photoelectric conversion layer. The photoelectric conversion layer PD3 may include a p-type organic semiconductor material and an n-type organic semiconductor material, and the p-type organic semiconductor material and the n-type organic semiconductor material may form a pn junction. As another example, the photoelectric conversion layer PD3 may include quantum dots or chalcogenide.

As described with reference to FIG. 1, the photoelectric conversion layer PD3 may absorb the third wavelength light L3 and may generate electric charges (e.g., electron-hole pairs) from the third wavelength light L3. The generated electric charges may be transferred to the first floating diffusion region FD1 through the lower electrode 230, the upper contact plug TCP, the penetration electrode 120, the first lower contact plug BCP1, the third connection line CL3, and the second lower contact plug BCP2 and may be cumulated in the first floating diffusion region FD1.

The upper electrode 240 may be provided on the photoelectric conversion layer PD3. The upper electrode 240 may correspond to the upper electrode 240 described with reference to FIG. 3. When viewed in a plan view, the upper electrode 240 may cover the active region AR and may cover a portion of the dummy region DR. When viewed in a plan view, the upper electrode 240 may expose a portion of the dummy region DR and may expose the peripheral region PR. When viewed in a plan view, the upper electrode 240 may cover the photoelectric conversion layer PD3.

The upper electrode 240 may not be in contact with the lower electrodes 230 of the active region AR. The upper electrode 240 may be in contact with some of the lower electrodes 230 of the dummy region DR and may not be in contact with others of the lower electrodes 230 of the dummy region DR. The upper electrode 240 may expose the others of the lower electrodes 230 of the dummy region DR. The upper electrode 240 may be in contact with some of the first lower electrodes 230a. The upper electrode 240 may be in contact with some of the second lower electrodes 230b.

A planar area of the upper electrode 240 may be larger than a planar area of the photoelectric conversion layer PD3 and may be smaller than planar areas of the pixel array regions AR and DR.

The upper electrode 240 may include a transparent conductive material. For example, the upper electrode 240 may include indium-tin oxide (ITO), indium-zinc oxide (IZO), zinc oxide (ZnO), and/or organic transparent conductive materials.

A capping layer 250 may be provided on the upper electrode 240. The capping layer 250 may be extended from the active region AR to the dummy region DR and the peripheral region PR. The capping layer 250 may include an insulating material. For example, the capping layer 250 may include aluminum oxide, silicon oxide, silicon nitride, and/or silicon oxynitride.

Micro lenses 260 may be provided on the capping layer 250 of the active region AR. When viewed in a plan view, the micro lenses 260 may be provided to correspond to the pixel regions PXR of the active region AR. Each of the micro lenses 260 may have a convex shape and may have a curvature radius. The curvature radius may be predetermined.

Unlike that shown in the drawings, the first and second pads 330 and 340 may not be covered with the capping layer 250. That is, the insulating structure 220 of the peripheral region PR may not be covered with the capping layer 250. In this case, the first and second pads 330 and 340 may be exposed to the outside.

Figure 10A:
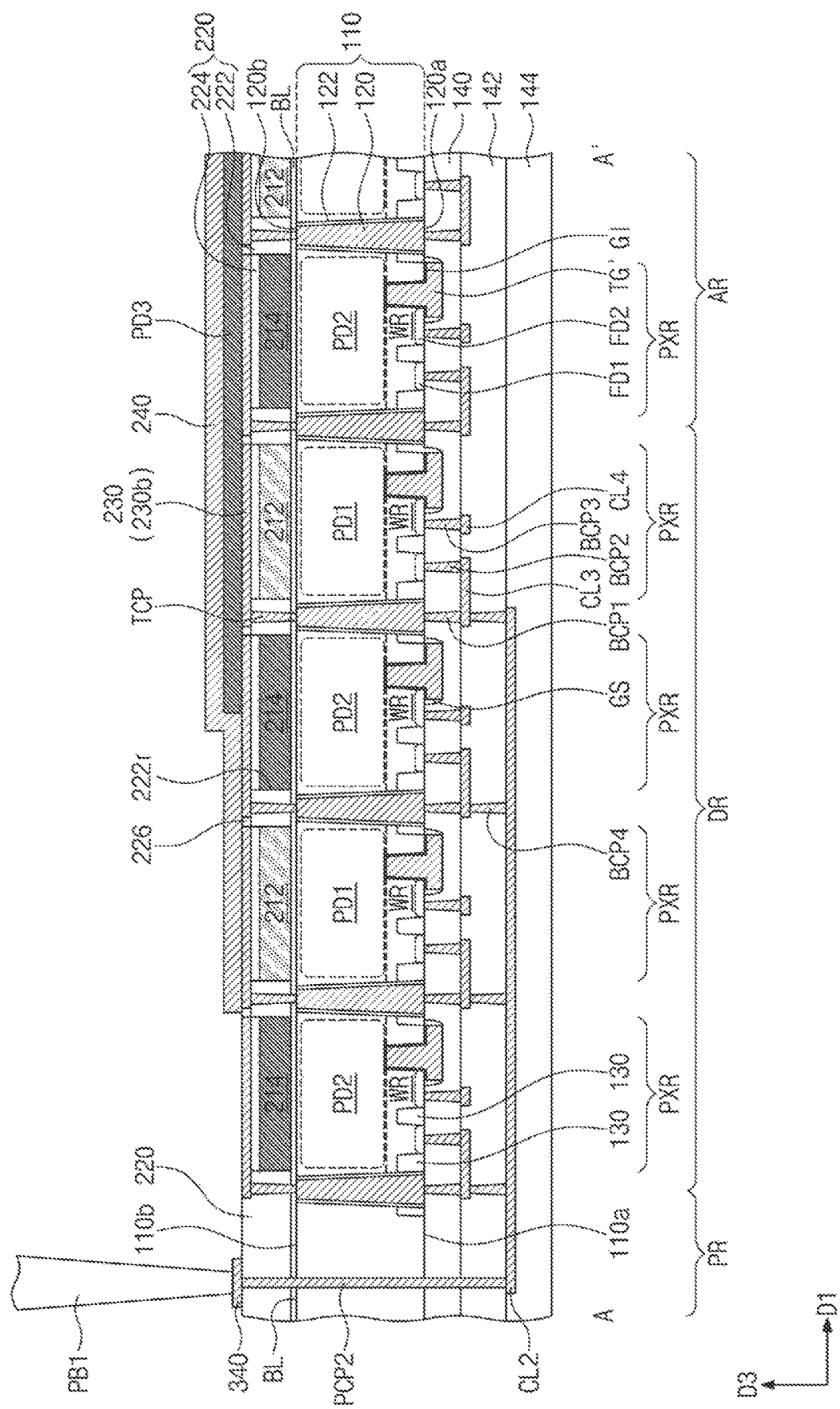
FIGS. 10A and 10B are sectional views, which are taken along lines A-A' and B-B', respectively, of FIG. 8 to illustrate a method of fabricating an image sensor according to an embodiment.
Figure 10B:
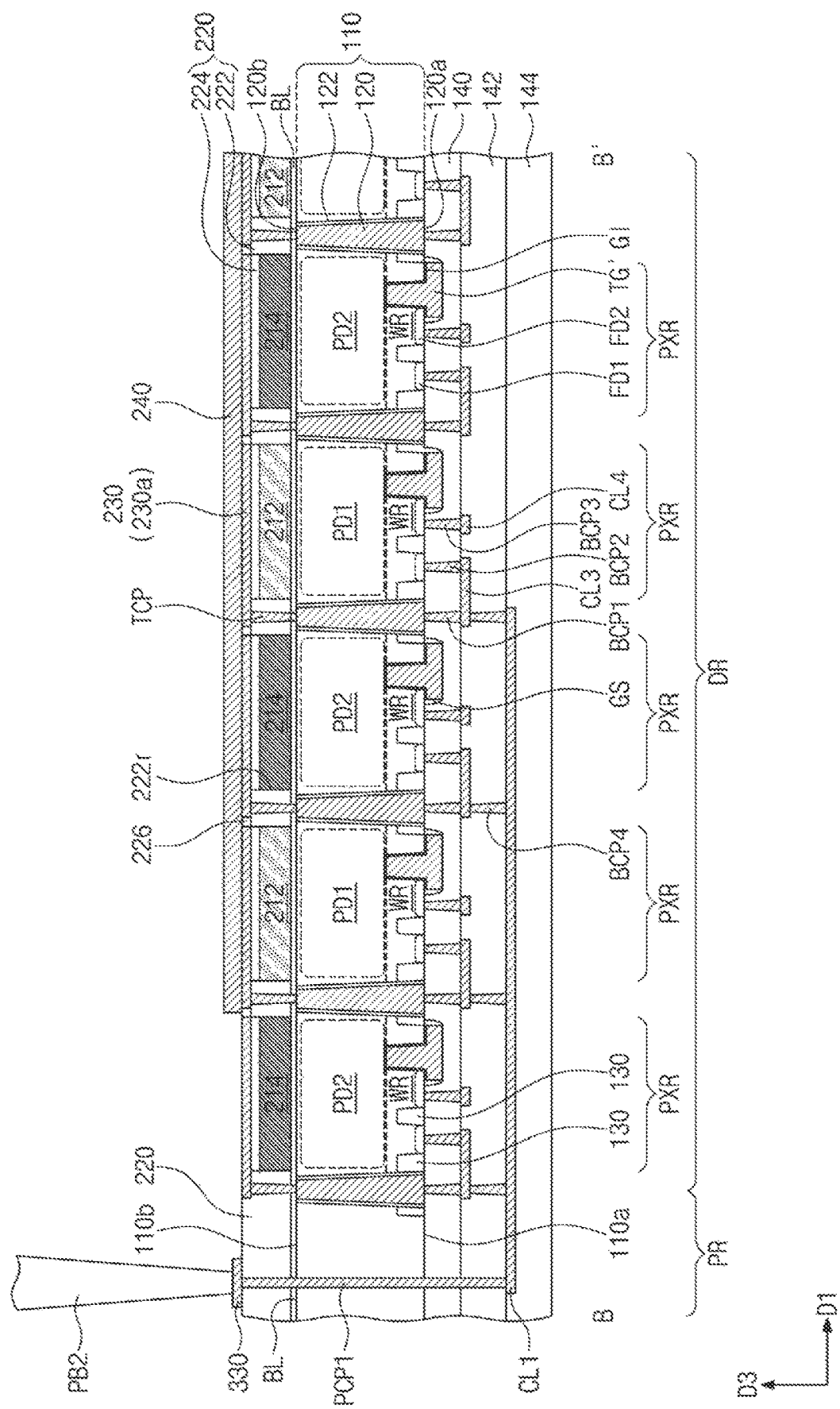

FIGS. 10A and 10B are sectional views, which are taken along lines A-A' and B-B', respectively, of FIG. 8 to illustrate a method of fabricating an image sensor according to an embodiment.

In a process of fabricating the image sensor 10 according to the present embodiment, the measurement unit 400 of FIG. 3 may be connected to the first and second pads 330 and 340, before the forming of the capping layer 250 described above. In detail, a first probe tip PB1 and a second probe tip PB2 connected to the measurement unit 400 may be placed to be in contact with the first and second pads 330 and 340, respectively. Accordingly, the measurement unit 400 may be electrically connected to the first and second pads 330 and 340.

The measurement unit 400 may be used to produce an electric current, which sequentially flows through the second pad 340, the second connection line CL2, the second lower electrodes 230b, the upper electrode 240, the first lower electrodes 230a, the first connection line CL1, and the first pad 330. In certain embodiments, the measurement unit 400 may be used to produce an electric current, which sequentially flows through the first pad 330, the first connection line CL1, the first lower electrodes 230a, the upper electrode 240, the second lower electrodes 230b, the second connection line CL2, and the second pad 340.

By measuring the magnitude of the electric current using the measurement unit and comparing it with the reference current, it may be possible to examine an alignment state of the photoelectric conversion layer PD3. When a difference between the measured current and the reference current is greater than a predetermined magnitude, the photoelectric conversion layer PD3 may be evaluated to be misaligned. In this case, a process condition in a process of forming the photoelectric conversion layer PD3 may be adjusted, such that the photoelectric conversion layer PD3 to be formed in a subsequent process can be aligned to the reference state.

Thereafter, the measurement unit 400 and the first and second probe tips PB1 and PB2 may be removed. The capping layer 250 may be formed on the upper electrode 240. The micro lenses 260 may be formed on the capping layer 250.

According to an embodiment of the inventive concept, an image sensor may be configured to supply an electric current to electrodes, which are disposed in regions above and below a photoelectric conversion layer, to make it possible to measure an alignment state of the photoelectric conversion layer and the electrodes.

While example embodiments of the inventive concepts have been particularly shown and described, it will be understood by one of ordinary skill in the art that variations in form and detail may be made therein without departing from the spirit and scope of the attached claims.

What is claimed is:

1. A method comprising:
   connecting a measurement unit to an image sensor, the image sensor comprising a substrate, first lower electrodes on the substrate, second lower electrodes on the substrate, a photoelectric conversion layer covering at least a portion of the second lower electrodes, an upper electrode covering the photoelectric conversion layer and at least a portion of the first and second lower electrodes, a first connection line connected to the first lower electrodes, and a second connection line connected to the second lower electrodes;
   producing an electric current, which flows through the second connection line, the second lower electrodes, the upper electrode, the first lower electrodes, and the first connection line, using the measurement unit; and
   measuring an alignment state of the lower electrodes, the photoelectric conversion layer, and the upper electrode.

2. The method of claim 1, wherein the measuring of the alignment state comprises measuring a number of the second lower electrodes in contact with the upper electrode.

3. The method of claim 1, wherein the measuring of the alignment state comprises measuring an amount of the electric current that flows through the second connection line, the second lower electrodes, the upper electrode, the first lower electrodes, and the first connection line.

4. The method of claim 1, wherein the measuring of the alignment state comprises:
   measuring a number of the first lower electrodes in contact with the upper electrode; and
   measuring a number of the second lower electrodes in contact with the upper electrode.

5. The method of claim 1, wherein the image sensor further comprises:
   a first pad contact plug, which penetrates the substrate and is connected to the first connection line; and
   a second pad contact plug, which penetrates the substrate and is connected to the second connection line.

6. The method of claim 1, wherein the image sensor further comprises an active region, a dummy region surrounding the active region, and a peripheral region surrounding the dummy region,
   the first connection line is connected to the first lower electrodes in the dummy region, and
   the second connection line is connected to the second lower electrodes in the dummy region.

7. The method of claim 6, wherein the image sensor further comprises:
   a first pad connected to the first connection line; and
   a second pad connected to the second connection line, and
   the first pad and the second pad are disposed in the peripheral region.

8. A method comprising:
   connecting a measurement unit to an image sensor, the image sensor comprising a substrate, first lower electrodes on the substrate, second lower electrodes on the substrate, a photoelectric conversion layer covering at least a portion of the second lower electrodes, and an upper electrode covering the photoelectric conversion layer and at least a portion of the first and second lower electrodes,
   producing an electric current, which flows through the second lower electrodes, the upper electrode, and the first lower electrodes, using the measurement unit; and
   measuring a number of the second lower electrodes in contact with the upper electrode.

9. The method of claim 8, further comprising measuring an alignment state of the first and second lower electrodes, the photoelectric conversion layer, and the upper electrode, using measurement information on the number of the second lower electrodes in contact with the upper electrode.

10. The method of claim 8, wherein the image sensor further comprises:
    a first connection line connected to the first lower electrodes; and
    a second connection line connected to the second lower electrodes.

11. The method of claim 10, wherein the image sensor comprises an active region, a dummy region surrounding the active region, and a peripheral region surrounding the dummy region,
    the first connection line is connected to the first lower electrodes in the dummy region, and
    the second connection line is connected to the second lower electrodes in the dummy region.

12. The method of claim 11, wherein the image sensor further comprises a first pad connected to the first connection line, and
    the first pad is disposed in the peripheral region.

13. The method of claim 12, wherein the image sensor further comprises a second pad connected to the second connection line, and
    the second pad is disposed in the peripheral region.

14. The method of claim 13, wherein the connecting of the measurement unit to the image sensor comprises connecting the measurement unit to the first pad and the second pad.

15. An image sensor comprising:
    a substrate having a first surface and a second surface facing each other;
    first lower electrodes and second lower electrodes provided on the first surface;
    a photoelectric conversion layer covering at least a portion of the second lower electrodes;
    an upper electrode covering the photoelectric conversion layer and at least a portion of the first and second lower electrodes;
    a first connection line connected to the first lower electrodes; and
    a second connection line connected to the second lower electrodes.

16. The image sensor of claim 15, wherein a number of the second lower electrodes in contact with the upper electrode is smaller than a number of the second lower electrodes connected to the second connection line.

17. The image sensor of claim 15, further comprising an active region, a dummy region surrounding the active region, and a peripheral region surrounding the dummy region,
    wherein the first connection line is connected to the first lower electrodes in the dummy region, and
    the second connection line is connected to the second lower electrodes in the dummy region.

18. The image sensor of claim 17, further comprising:
a first pad contact plug, which penetrates the peripheral region of the substrate and is connected to the first connection line; and
a second pad contact plug, which penetrates the peripheral region of the substrate and is connected to the second connection line.

19. The image sensor of claim 18, further comprising:
a first pad connected to the first pad contact plug; and
a second pad connected to the second pad contact plug, wherein the first and second pads are disposed in the peripheral region.

20. The image sensor of claim 17, wherein bottom surfaces of the first and second pads are provided on a same plane as a bottom surface of the upper electrode.

* * * * *